United States Patent [19]

Gilles et al.

[11] 4,021,844
[45] May 3, 1977

[54] PHOTOSENSITIVE DIODE ARRAY STORAGE TARGET

[75] Inventors: Jean-Roger Gilles; Daniel Woehrn, both of Paris, France

[73] Assignee: Thomson-CSF, Paris Cedex, France

[22] Filed: June 6, 1975

[21] Appl. No.: 584,263

Related U.S. Application Data

[63] Continuation of Ser. No. 419,365, Nov. 27, 1973, abandoned.

[30] Foreign Application Priority Data

Dec. 1, 1972   France .......................... 72.42826

[52] U.S. Cl. ..................... 357/31; 357 89; 357/30
[51] Int. Cl.² ....................................... H01L 27/14
[58] Field of Search ................... 357/31, 30, 89

[56] References Cited

UNITED STATES PATENTS

| | | | |
|---|---|---|---|
| 3,649,889 | 3/1972 | Hart | 317/235 R |
| 3,676,727 | 7/1972 | Dalton | 313/66 |

*Primary Examiner*—Martin H. Edlow
*Attorney, Agent, or Firm*—Roland Plottel

[57]   ABSTRACT

A storage target comprising a photosensitive diode array which can be used to convert an optical image into an electronic image where the photo diodes are constituted by "hyper abrupt" junctions having a junction capacitance of wide dynamic range when reverse biased and having consequently a remanence which is variable as a function of the reverse voltage applied to them.

8 Claims, 6 Drawing Figures

PHOTOSENSITIVE DIODE ARRAY STORAGE TARGET

This is a continuation, of application Ser. No. 419,365, filed Nov. 27, 1973, now abandoned.

The present invention relates to a target with storage properties, for converting an optical image into an electronic image, which can be used for example in camera tubes in order to convert an optical image into a video signal.

At the present time, numerous kinds of photosensitive targets of this kind, with storage properties, are known. Certain of them utilise a continuous layer of photosensitive material, and these include for example the kinds of targets used in conventional vidicon tubes; others, developed more recently, utilise arrays of reverse-biased photosensitive diodes which are semiconductor diodes whose junction capacitance constitutes the "memory" element of the target.

It is targets of this latter kind, usng a photo diode array, with which the present invention is concerned. The structure and operation of prior art, therefore now classical, targets will be briefly described later on.

Let us meanwhile simply bear in mind that the memory function of these targets, which is provided by the junction capacitance of the diodes in the array, depends, as does this capacitance, upon the value of the reverse bias voltage applied to the diodes. In the ordinary way, the law of variation of the junction capacitance of a reverse-biased diode, is such that said capacitance varies very little if the bias voltage is changed within reasonable limits; such reasonable limits for example include not exceeding the break-down voltage of the diodes. The result is that the memory of the target or to put it another way, its "remanence", are not capable of significant variations.

In a general way and here in particular, the remanence of a storage device can be defined, for example, as the fraction of the initial stationary signal which is delivered by the device, a certain time T after excitation has ceased (extinction remanence), or as the fraction of the stationary signal which is delivered by the device, a certain time T after excitation has commenced (starting remanence).

However, there are certain applications such for example as the observation of radiological pictures, interference fringes, infra red camera applications, night time television work, etcetera, where it would be beneficial to have targets possessing a remanence which is sufficiently controllable to be able to improve the image (picture) quality. This is because such observations are generally blurred by rapid and erratic position or luminosity variations of low amplitude, which it would be desirable to emiminate. Variable remanence targets would, by adjustment of the target voltage, make it possible to avoid such parasitic noise, thus improving the quality of the observation.

The object of the present invention is to provide photosensitive targets which have this kind of variable remanence, the photo diodes which make up the target being designed in accordance with a particular technique which gives their junction capacitance a wide dynamic range as a function of the reverse bias voltage applied to them.

According to the invention there is provided a photosensitive target with storage properties for converting an optical image to an electronic image, comprising: a semiconductor substrate of a first conductivity type, upon said substrate, an array of zones of a second conductivity type forming with said substrate, an array of photo diodes for being reversely biased by a reverse bias voltage V, said photo diodes being constituted by "hyper-abrupt" junctions whose junction capacitance C varies in accordance with the reverse bias voltage V applied to them when operating in proportion with $V^{-m}$, where $m > \frac{1}{2}$, and upon said array of photo diodes an array of insulating material zones, said insulating material zones being disposed between said photo diodes.

Hyper-abrupt junction diodes of this kind are well known per se; they constitute what are more familiarly known as "varactors" or "varicaps". The invention relates more particularly to the application of junctions of this kind to a photosensitive target in order to create a target of variable remanence characteristics.

These and other objects, features and advantages of our invention will be better understood from a consideration of the following description illustrated by the accompanying drawings in which.

Figure 1:
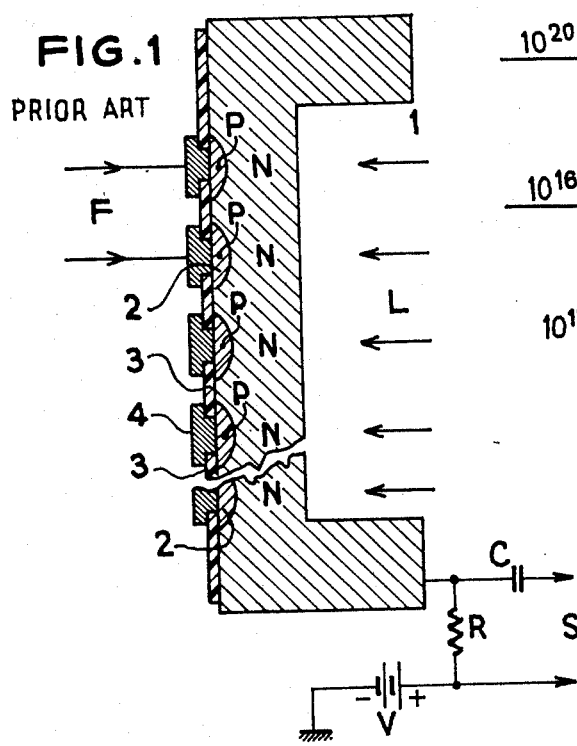
FIG. 1 is a schematic sectional view of part of a photosensitive target with a storage behavior, in accordance with the prior art.

The structure and operation of prior art diode array targets, will be briefly recapitulated with reference to FIG. 1. Targets of this kind have been described in detailed fashion in literature on the subject, and in particular in the two U.S. Pat. Nos. 3,011,089 and 3,403,284 respectively filed upon the 16th Apr. 1958 and the 24th Sept. 1968. We will confine ourselves here to an explanation of the essential elements required for an understanding of the invention.

In a general way, these targets comprise a semi-conductor wafer 1 acting as substrate, here of N type, and a certain number of small zones 2 having a conductivity type which is opposite that of the substrate, P type here, constituting the diode array. These diodes are normally reverse biased by a direct voltage source V. At the side constituted by the substrate 1, the target is struck by the light rays L coming from the optical image which is to be processed, whilst a beam of electrons F strikes its other side. It is well known, from U.S. Pat. No. 3,403,284 in particular, to utilise an electron beam F striking several junctions at once, to separate these junctions at the surface by an insulator 3 so that the beam F is prevented from striking the substrate 1 and consequently producing parasitic currents there, and to artificially increase the area of each P type region 2 struck by the beam F, by covering them with conductive studs 4 overlapping onto the insulator 3, this increasing the capacitive coupling between each P type region and the N type substrate.

The operation of this kind of target, to summarise it, is as follows. When the electron beam F is scanning the target in the absence of any light L, it charges up all the diodes to the potential $-V$. This charge can be considered as the charge developed by the junction capacitance of the reverse-polarised diode, which capacitance, as those skilled in the art will appreciate, is inversely proportional to the thickness of the junction space charge zone. However, the thickness of this zone, in a conventional or classic junction, reverse biased by a voltage V, is given by the equation $e = k \sqrt{V}$. The capacitance is therefore inversely proportional to $\sqrt{V}$ and its impedance is proportional to $\sqrt{V}$.

The remanence of the target in the absence of any light L, is, of course, a function of this impedance since it is directly associated with the time taken by the junction capacitance to discharge and therefore itself varies as $\sqrt{V}$.

If the light rays L reach the target, the photons absorbed by the substrate N will create in the junctions electron-hole pairs (this is the photosensitive phenomenon inherent in P-N junctions), which facilitate the transfer of electrical charges across said junctions. The diodes will therefore discharge and indeed the more so the greater the intensity of the light striking them. An electrical image is thus created on the target. The remanence of this image depends, as has just be demonstrated, upon $\sqrt{V}$ and does not therefore vary very much with V.

When the electron beam F scans the target again, it charges again the diodes to the potential $-V$. The result is that through the resistance R there flows an electron current which is the stronger the more the scanned diodes have been discharged and thus the more they have been illuminated. The signal S, picked up after the capacitor, is thus a classic video signal, characteristic of the optical image projected on to the target.

The object of the invention, as already stated, is to create targets of this kind which have a remanence variable within much wider limits for the same variations in the reverse bias voltage V.

To achieve this result, the targets in accordance with the invention do not utilise conventional junctions whose reverse bias capacitance varies as a function of $V^{-1/2}$, but hyper-abrupt junctions whose reverse bias capacitance varies as $V^{-m}$, where $m > \frac{1}{2}$ and for example $m = 2$. Junctions of this kind are well known to those skilled in the art; they are generally utilised to constitute variable-capacitance diodes, in other words varicaps or varactors to use conventional terminology. Different methods, now classic in fact, can be utilised to produce junctions of this kind, as for example diffusion techniques commencing from solid, liquid, gaseous sources, ion implantation, or again epitaxy.

Figure 2:
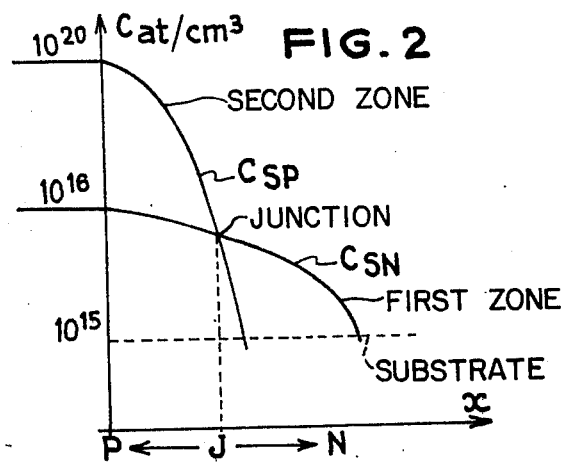
FIG. 2 illustrates graphs showing the impurity concentrations at the surface of a hyper-abrupt junction of the kind used in the targets in accordance with the invention.

In a general way, in order to create a hyper-abrupt junction, it is necesssary to produce an impurity distribution profile whose form corresponds with that shown in FIG. 2. In this graph, on the ordinates the N-type and P-type (CSN, CSP) impurity concentrations at the surface of a P-N junction have been plotted as a function of the distance x from said junction J.

To achieve a rapid variation in concentration at the junction, this being the characteristic of a hyper-abrupt function, a very high P-type impurity doping level, for example $10^{20}$ atoms/cm$^3$, and a lower N-type impurity doping level, $10^{16}$ atoms/cm$^3$, for example, are used.

The various methods utilised, produce different junction structures. Examples of such methods are described for example in an article by A. SHIMIZU and I. NISHIZAWA published in "IRE Transactions on electron devices" volume ED. 8 pages 370 to 377, September 1961, and entitled: "Alloy-diffused variable capacitance diode with large figure-of-merit", or again in an article by Peter J. KANNAM, Samuel PONCZAK and John A. OLMSTEAD, published in "IEEE Transactions on Electronic Devices", volume ED. 18 No. 2, pages 109 to 115, February 1971 and entitled "Design Considerations of Hyper-abrupt Varactor Diodes".

The targets in accordance with the invention, more particularly described here, are created by two double-diffusion methods, it being understood that other methods which create hyper-abrupt junctions, can also be used.

Figure 3:
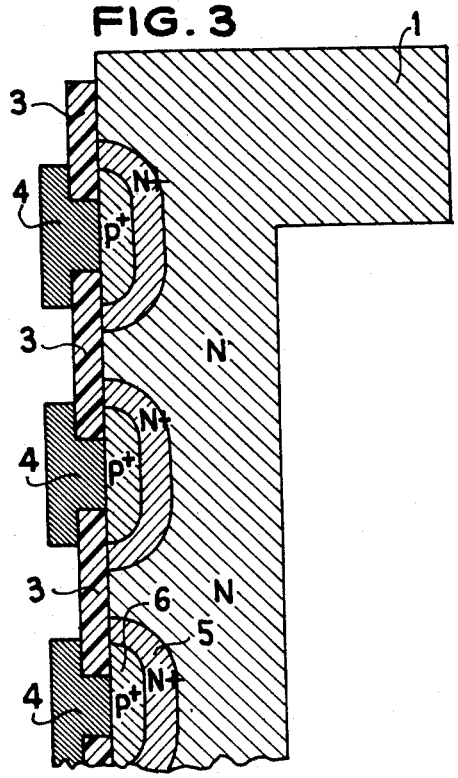
FIG. 3 is a schematic sectional view of part of a target in accordance with the invention, produced in accordance with a first method.

FIG. 3 schematically illustrates in section, part of an improved target in accordance with the invention, designed in accordance with a first of these two methods.

Self-evidently, the general structure of the target shown in FIG. 1, namely the semiconductor wafer 1, here of N-type, the photosensitive diodes, the insulator 3 and the conductive studs 4, recurs again. The structure of the diodes themselves is different, however, they are constituted by a first diffused zone 5 made up of impurities of the same kind as those in the substrate, N-type in this case, having a low impurity concentration, i.e. $N^+$, and of a second diffused zone 6 made up of impurities of P-type with a high impurity concentration, referred to here as $P^+$, the depth of which is less than that of the $N^+$ diffusion zone. Each of the photodiodes thus has $P^+N^+$ N structure N being the substrate. They could, of course, have the symmetrical structure $N^+P^+$ P, P being the substrate. The profile of the surface concentrations of these $P^+N^+$ N junctions is that shown in FIG. 2, the point J illustrating the junction between the $P^+$ zone and the $N^+$ zone; the concentration of $10^{15}$ atoms per cm$^3$ is that of the substrate N.

A simple method of producing this kind of target consists in covering a silicon semiconductor wafer, here of N-type, with a thin film of an insulator, for example silicon dioxide or silicon nitride, and in using conventional techniques to etch windows which receive the diffused zones. A first operation of diffusion of N-type impurities, at a relatively low concentration yields the zones 5 of $N^+$ type, the impurity concentration of which is in the order of $10^{16}$ atom/cm$^3$. A second self-centred diffusion operation, using P-type impurities of higher concentration but smaller depth, yields the $P^+$ type zones whose impurity concentration is in the order of $10^{20}$ atoms/cm$^3$. The diodes are thus covered with a layer of conductive material which, when etched, produces the isolated conductive studs 4 on each diode (it will be noted that the conductive studs to some extent improve the operation of the target, but are not essential to its operation). The substrate is then thinned down to a thickness in the order of 15 microns and can undergo the kinds of processes required for its particular function, for example in the case of a camera tube deposition of an anti-reflection coating etcetera, etcetera.

Figure 4:
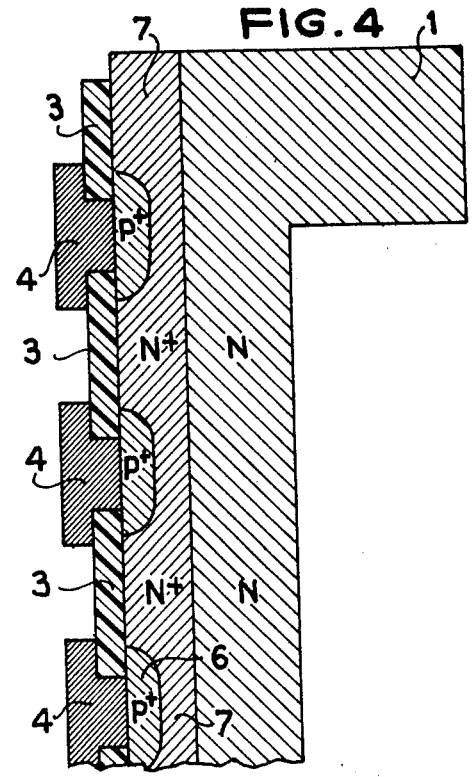
FIG. 4 is a variant embodiment of that shown in FIG. 3, in which the target in accordance with the invention is produced by a second method.

FIG. 4 illustrates a variant embodiment of the target shown in FIG. 3. Here, the diodes are of the same overall design as those in FIG. 3, that is to say that they have a $P^+N^+N$ structure, N being the substrate (or $N^+P^+P$, in which case P is the substrate), but the insulated zones 5 of N⁺ type being replaced by a continuous N⁺ type zone 7. The method of creating this kind of target differs from the preceding method in that the first diffusion operation, yielding the N⁻ type layer, is carried out at the start of the process before the formation of the insulating material which is used as a mask in the diffusion operations. This method, and the resultant structure, makes it possible to improve the insulation between the diodes by increasing the reverse potential. On the other hand, they have the drawback of reducing the breakdown voltage or each P⁺N⁺N diode.

Figure 5:
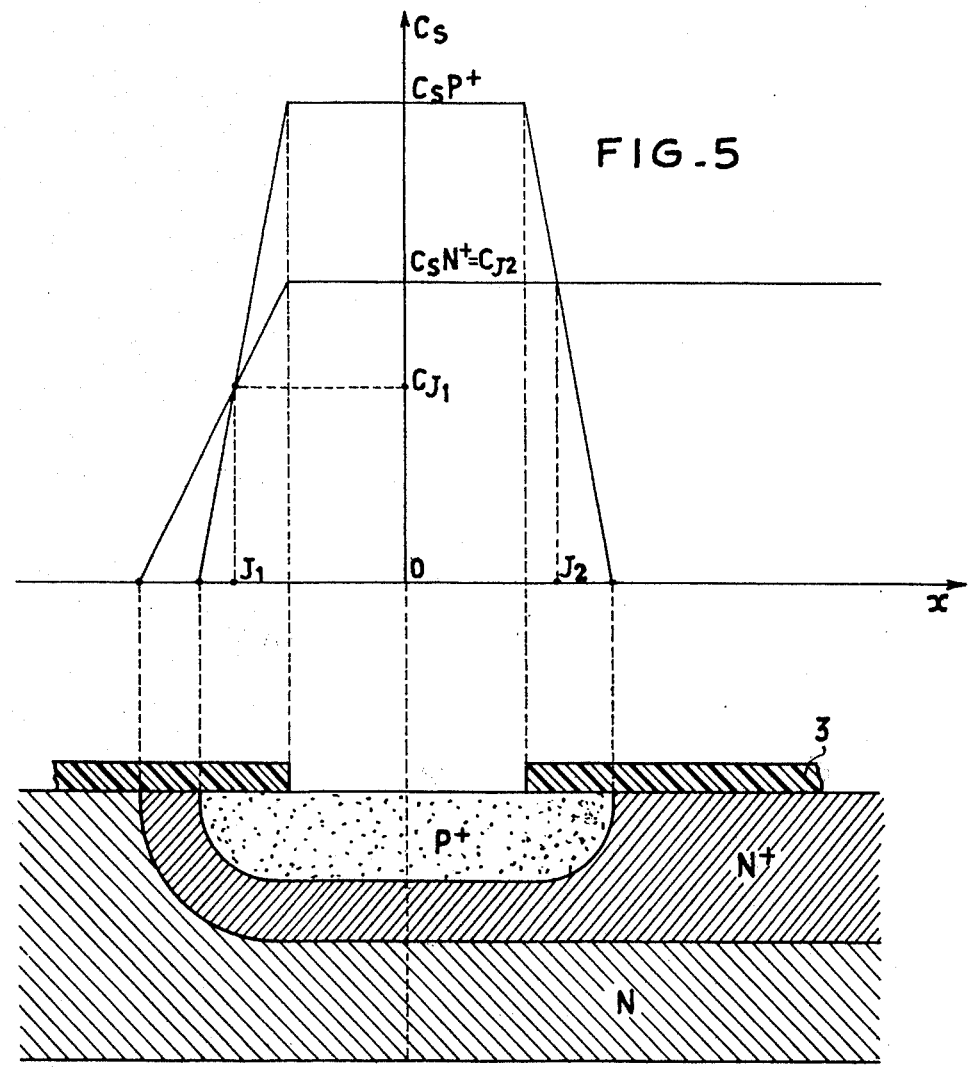
FIG. 5 is a schematic sectional view of the two variant embodiments (a) and (b) of junctions produced by the two methods described in FIGS. 3 and 4, and of the corresponding surface impurity concentrations.

FIG. 5 schematically illustrates a section through a diode of the kind shown in FIG. 3, at the left-hand side of the Figure, and through a diode of the kind shown in FIG. 4, at the right-hand side.

It also illustrates the impurity concentrations at the surface (axis O x), as a function of the distance x from the centre O of the diode. These surface concentrations $C_s$ have not been illustrated to scale; the axis Oz taken as the origin of the concentrations, in fact represents the substrate impurity concentration.

These two graphs, showing the concentrations of N-type impurities (CSN⁺) and P type impurities (CSP⁺), illustrate that the N⁺ impurity concentrations at the junction $J_1$ on the left-hand of the Figure, (method of FIG. 3), and at the junction $J_2$ on the right-hand of the figure (method shown in FIG. 4), differ from one another. $J_1$ and $J_2$ are the points at which the concentration of N⁺ type impurities is equal to the concentration of P⁺ type impurities; this concentration is less at $J_1$ than it is at $J_2$. However, the breakdown voltage of the diode depends upon the N⁺ type impurity concentration at the depth J ($J_1$ or $J_2$), this breakdown voltage being the lower the higher said concentration is. This explains why the first method (left-hand side) leads to a higher breakdown voltage than the second method (right-hand side).

The targets in accordance with the invention, whose capacitance and therefore remanence, may be adjusted by varying the target bias voltage, the voltage V, can be utilised in a variety of devices in which a target must be capable of retaining the charges which represent an electronic image. They may, for example, be utilised in storage tubes, standard conversion tubes, and also scanner tubes.

Figure 6:
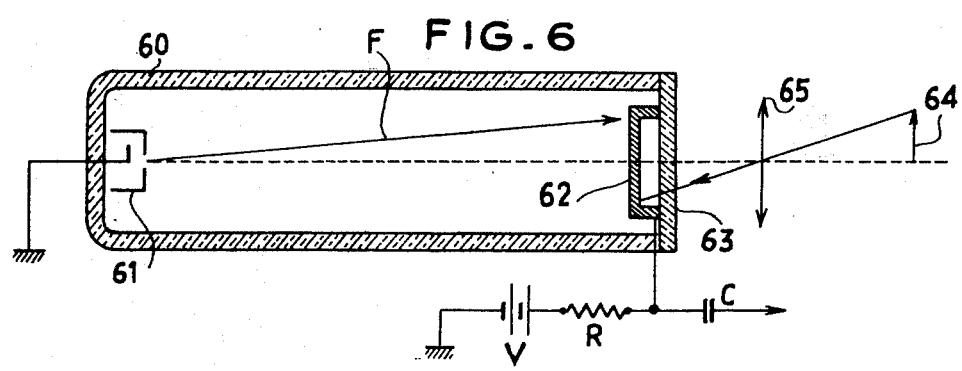
FIG. 6 is a sectional, highly schematic view, of an embodiment of a camera tube employing a target in accordance with the invention.

FIG. 6 provides a highly schematic illustration of an example of the application of the invention to a vidicon camera tube, in which only those elements directly concerned with the invention have been illustrated.

In an evacuated envelope 60, in the conventional fashion, there are arranged an electron-gun 61 emitting an electron beam F capable of scanning a photosensitive target; the accelerator, focusing and deflection means for the beam, of conventional form, have not been shown. The target 62 is a target of the kind in accordance with the invention. Through a transparent face 63 of the sealed envelope 60, it receives the optical image of an object 64 via a suitable optical device 65. The target 62 is biased, as already mentioned, by a voltage V which biases the diodes in the reverse sense. The video signal is picked up across a capacitor G.

Of course, the invention is not limited to the embodiment described and shown which was given solely by way of example.

What is claimed is:

1. A photosensitive target with storage properties for converting an optical image to an electronic image, comprising:
    a semiconductor substrate of a first conductivity type,
    upon said substrate, an array of zones of a second conductivity type forming, with said substrate an array of photodiodes,
    means for reverse biasing said photo-diodes,
    said photodiodes being constituted by hyper-abrupt junctions whose junction capacitance C varies in accordance with the reverse bias voltage V applied to them by said reverse biasing means, in proportion with $V^{-m}$, where $m > \frac{1}{2}$,
    and upon said array of photo-diodes an array of insulating material zones, said insulating material zones being disposed between said photo-diodes.

2. A photosensitive target according to claim 1, wherein each of said hyper-abrupt junctions is constituted successively, working from the substrate towards the surface where are disposed said insulating material zones, by a first zone containing impurities of the same kind as those in the substrate, and by a second zone comprising impurities of opposite kind to those in the substrate, the impurity concentration of said first zone being less than that of said second zone.

3. A photosensitive target according to claim 2, wherein said first zone of said junctions, constitute a continuous layer covering the substrate.

4. A method of manufacturing a photosensitive target according to claim 2, wherein:
    a semiconductor wafer or substrate is covered with a thin film of an insulating material;
    said thin film is etched in order to expose the surface of those zones of the substrate which are intended to constitute the array of photodiodes;
    a first, low-concentration diffusion operation, employing impurities of the same type as those encountered in the substrate, is carried out in order to create said first zones;
    a second, high-concentration diffusion operation, to a smaller depth than that reached by the first, using impurities of the opposite type to those encountered in the substrate, is carried out in order to create said second zones.

5. A method of manufacturing a photosensitive target according to claim 3, wherein:
    a semiconductor wafer or substrate is subjected to a first, low-concentration diffusion operation, using impurities of the same type as those encountered in said substrate, in order to form the continuous layer creating said first zones;
    the wafer thus processes, is covered with a thin film of insulating material;
    said thin film is eteched in order to expose the surface of the processed wafer and those zones which are intented to constitute the network of photo diodes;
    a second, high concentration diffusion operation, to a smaller depth than that reached by the first operation, using impurities of the type opposite to those encountered in the substrate, is carried out in order to create said second zones.

6. A photosensitive target with storage properties for converting an optical image to an electronic image, comprising:

an array of photo-diodes formed in a semiconductor substrate of a first conductivity type having a first kind of impurity, means for reverse biasing said photo-diodes, and an array of insulating material zones disposed between said photo-diodes, said photo-diodes being constituted (successively, working from the substrate towards the surface where are disposed said insulating material zones, by said substrate, by a first zone containing impurities of the same kind as those in said substrate, and by a second zone containing impurities of opposite kind to those in the substrate, the impurity concentration of said first zone being less than that of said second zone and more than that of said substrate, said photo-diodes thus being constituted by hyper-abrupt junctions.

7. A target according to claim 6 wherein said substrate and said first zone are N-type; and said second zone is P type, and said second zone has no direct contact with said substrate.

8. In a photosensitive target with storage properties for converting an optical image to an electronic image when scanned by an electron beam, said target comprising: an array of photo-diodes formed into a surface of a N-type semiconductor substrate having a predetermined impurity concentration; means for reverse biasing said photodiodes; and an array of insulating material zones disposed onto said surface of said substrate between said photo-diodes; the improvement consisting in realising each of said photo-diodes by a hyper-abrupt junction, each said photo-diode being constituted successively working from the side of said substrate opposite said surface supporting said insulating material zones, to said surface supporting said insulating material zone by:

a. said N-type substrate having said predetermined impurity concentration, b. a zone of the N-type having an impurity concentration higher than that of said substrate, and c. a zone of the P-type having an impurity concentration higher than that of said N-type zone, said N-type zones being interposed between said P-type zones and said substrate in such a way that said P-type zones have no contact with said N-type substrate.

* * * * *